United States Patent

Yamamoto et al.

[11] Patent Number: 6,126,772
[45] Date of Patent: Oct. 3, 2000

[54] METHOD FOR RESIST REMOVAL, AND ADHESIVE OR ADHESIVE SHEET FOR USE IN THE SAME

[75] Inventors: Takayuki Yamamoto; Tatsuya Kubozono; Yasuo Kihara; Yuji Okawa; Koichi Hashimoto; Takeshi Matsumura; Tatsuya Sekido; Masayuki Yamamoto; Chiaki Harada, all of Osaka, Japan

[73] Assignee: Nitto Denko Corporation, Osaka, Japan

[21] Appl. No.: 08/973,984

[22] PCT Filed: Jun. 13, 1996

[86] PCT No.: PCT/JP96/01621

§ 371 Date: Dec. 15, 1997

§ 102(e) Date: Dec. 15, 1997

[87] PCT Pub. No.: WO97/00534

PCT Pub. Date: Jan. 3, 1997

[30] Foreign Application Priority Data

Jun. 15, 1995 [JP] Japan .................................. 7-174313
Jun. 30, 1995 [JP] Japan .................................. 7-188221
Jul. 19, 1995 [JP] Japan .................................. 7-206471
Mar. 29, 1996 [JP] Japan .................................. 8-075634

[51] Int. Cl.$^7$ .................................................. B32B 35/00
[52] U.S. Cl. ........................ 156/247; 156/275.5; 156/344
[58] Field of Search .................................. 156/344, 584, 156/230, 234, 241, 275.5, 275.7, 247

[56] References Cited

U.S. PATENT DOCUMENTS

| | | | |
|---|---|---|---|
| 4,199,646 | 4/1980 | Hori et al. | 428/344 |
| 5,110,388 | 5/1992 | Komiyama et al. | 156/275.5 X |
| 5,466,325 | 11/1995 | Mizuno et al. | 156/344 |
| 5,501,897 | 3/1996 | Ichikawa et al. | 428/343 X |
| 5,665,473 | 9/1997 | Okoshi et al. | 428/457 |
| 5,759,336 | 6/1998 | Yamamoto et al. | 156/344 X |
| 5,895,714 | 4/1999 | Malek | 428/337 |
| 5,902,678 | 5/1999 | Konda et al. | 428/345 |

FOREIGN PATENT DOCUMENTS 4-345015 12/1992 Japan .
5-275324 10/1993 Japan .

*Primary Examiner*—Mark A. Osele
*Attorney, Agent, or Firm*—Sughrue, Mion, Zinn, Macpeak & Seas, PLLC

[57] ABSTRACT

An object is to peel off a disused resist from an article, e.g., a silicon wafer, with an adhesive sheet while preventing impurities contained in the adhesive sheet from transferring to the surface of the article, e.g., wafer, and from thus arousing electrical troubles resulting in problems such as decreases in the yield and reliability of the article. A method for resist removal comprising forming an adhesive layer on an article on which a resist is present and peeling the adhesive layer as a united sheet including the resist material from the article, characterized in that the adhesive layer has been regulated so as to have a modulus of elasticity of 1 Kg/mm$^2$ or higher in the peeling, and an adhesive or an adhesive sheet both for use in the method.

8 Claims, No Drawings

METHOD FOR RESIST REMOVAL, AND ADHESIVE OR ADHESIVE SHEET FOR USE IN THE SAME

TECHNICAL FIELD

The present invention relates to a method for removing a disused resist material (resist film image) present on an article such as a semiconductor wafer in the production of finely processed parts such as semiconductors, circuits, various printed boards, various masks and lead frames, and an adhesive or adhesive sheet for use in the method.

The following explanations are given mainly by reference to the production of semiconductor devices. However, the present invention should not be construed as being limited in applications thereof, and is applicable to any article on which a pattern comprising a resist material is present. The present invention is especially suitable for the removal of a disused ion-implanted resist material from a wafer in the production of a semiconductor device.

BACKGROUND ART

A lithographic step using a resist is utilized recently in various fields.

In this lithographic step, a resist applied on a substrate or the like is partly removed by development and the exposed areas or remaining areas are suitably processed. This step is intended to thus impart a desired function to the corresponding areas of the substrate. After completion of the function impartation, the resist is removed.

In the production of a semiconductor device, for example, a resist material is applied on a semiconductor substrate such as a silicon wafer, and an image comprising a resist pattern is formed by ordinary photoprocessing. This resist pattern is used as a mask to subject the exposed areas to various treatments such as implantation of ions, e.g., $P^+$, $B^+$, or $As^+$, and etching. In the implantation treatment, such ions are implanted also in an upper surface layer of the resist film image. Thereafter, the disused resist material is removed to form a predetermined circuit. Subsequently, a cycle consisting of the re-application of a resist material, image formation, etching, and the removal of the resist material is repeated in order to form a next circuit. Also in the case of forming a circuit on various substrates, the resist material disused after the formation of a resist pattern is removed.

The removal of a disused resist material is generally accomplished with an asher (ashing means), a solvent (remover), a chemical, etc. However, use of an asher for resist material removal is disadvantageous in that the operation needs much time, and that impurity ions contained in the resist material and the implanted ions remain on the semiconductor substrate and come into the semiconductor substrate as a result of a heat treatment conducted later. This inclusion of ions arouses a fear that a semiconductor integrated circuit may not be formed as designed, so that there are cases where a semiconductor device having impaired properties results. When an oxygen plasma is used as an ashing means, there are cases where the semiconductor substrate may be damaged, resulting in a semiconductor device having impaired reliability.

Furthermore, the wet cleaning method using a solvent or chemical (wet process) is disadvantageous in that much labor is required, for example, for preventing reverse fouling by the liquid used and for the disposal of the liquid after use. In particular, in APM cleaning with an $NH_4OH/H_2O_2/H_2O$ liquid mixture, there is another problem that the silicon substrate is etched, and an improvement in this respect is desired. There has been still another problem that the working atmosphere is impaired.

Under these circumstances, the present applicants proposed, in official gazettes including Unexamined Published Japanese Patent Applications Nos. 4-345015 and 5-275324, a method for resist material removal which comprises applying an adhesive sheet in the form of sheet, tape, or the like to the upper surface of a resist pattern and then peeling the adhesive sheet as a united sheet including the resist material. This method is free from the problems that impurity ions contained in the resist material are implanted in the wafer and that the working atmosphere is impaired. This method is expected to be put to practical use as a simple and reliable method for removal.

However, an investigation made by the present inventors revealed that the above-described method using an adhesive sheet has the following problem. In the case where arsenic or other ions were implanted in a large dose (e.g., $1 \times 10^{15}$ ions/$cm^2$ or more) or in a large energy amount (e.g., 1 MeV or more) and this ion implantation has denatured a surface layer of the resist pattern, removability of the resist material with the adhesive sheet is deteriorated and it is difficult to completely peel off and remove the whole resist from the wafer surface.

In particular, in the case of ion implantation in a large energy amount, there has been a problem that it is extremely difficult to completely peel off and remove the whole resist from the wafer surface because the resist material to be removed has a relatively large thickness (about 2 to 5 $\mu$m).

Accordingly, an object of the present invention is to provide a method capable of easily removing, without fail, a disused resist material from an article irrespective of the denaturation of a resist material surface layer caused by ion implantation, the thickness of the resist, etc., and to provide an adhesive or adhesive sheet for use in the method.

This sheet method has problems that impurities contained in the adhesive sheet diffuse into the resist film and then transfer to the substrate surface, and that impurities contained in the adhesive are directly transferred to the substrate surface in the areas where the adhesive sheet comes into direct contact with the substrate surface (the areas where the resist material is not present). That is, since the transferred substances contain metals such as alkali metals, alkaline earth metals, transition metals, and antimony, these metals pose problems such as junction leakage and a reduced charge retention time in DRAM, for example, in a semiconductor device if they remain on the substrate surface after completion of the step. Although light metals can be relatively effectively removed by conducting RCA cleaning or the like after use of the sheet method, the removal of transition and other metals remaining in a slight amount is extremely difficult. Hence, the above problems remain unsolved.

In view of these circumstances, another object of the present invention is to peel off a disused resist from an article, e.g., a silicon wafer, with an adhesive sheet while preventing impurities contained in the adhesive sheet from transferring to the surface of the article, e.g., wafer, and thus arousing electrical troubles resulting in problems such as decreases in the yield and reliability of the article.

SUBJECTS FOR THE INVENTION

The present inventors made intensive studies on the objects described above. As a result, they found that when a layer of an adhesive formed on a resist material is regulated so as to have specific properties, satisfactory results are obtained with respect to the peeling of this adhesive layer as a united sheet including the resist material and the resist material can be easily peeled off the article without fail irrespective of whether a surface layer of the resist material has been denatured or not. The present invention has been completed based on this finding.

The present inventors further found the following. First, the impurities transferred to a wafer or the like are not limited to those originally contained in the adhesive. There are cases where impurities contained in the substrate diffuse and migrate into the adhesive. In the case of an adhesive sheet having a separator laminated thereto, there is a phenomenon in which impurities diffuse and migrate from the separator into the adhesive. It was thus found that impurities present in the substrate or adhesive in an adhesive sheet from which the separator has been stripped off in preparation for application to a wafer or the like transfer to the surface of an article such as a wafer to cause the problems described above.

The following was also found. Impurities contained, in particular, in a substrate and a separator or the like are attributable to the metallic elements, e.g., antimony, or compounds thereof which are used as polymerization catalysts in synthesizing resins, e.g., polyester resins, to be used as the materials of the substrate, separator, etc. These metallic elements come into the sheet usually in an amount on the order of about 100 ppm, and they diffuse and migrate into the adhesive and finally transfer to a wafer surface, etc.

Based on these findings, the present inventors produced an adhesive sheet as follows. An element forming a diamond lattice as a crystal structure, e.g., a Group IVA element of the periodic table such as carbon, silicon, germanium, or tin, or a compound thereof was used as a polymerization catalyst in synthesizing a polyester or another resin. Due to the catalyst, a substrate or separator made of this resin was reduced in the content of other kinds of metallic elements including antimony. On this substrate or separator was formed an adhesive likewise reduced in the content of other kinds of metallic elements including antimony to thereby produce an adhesive sheet.

It was found that when this adhesive sheet is applied to an article, e.g., a wafer, having a resist film image to conduct peeling treatment, not only the amount of metallic elements such as antimony transferred to the surface of the article, e.g., wafer, is reduced, but also the Group IVA element of the periodic table used as a polymerization catalyst, even when transferred to the surface of the article, e.g., wafer, does not arouse electrical troubles in the wafer or the like because of the low electrical activity of the element, whereby the yield and reliability of the article from which the resist has been peeled off are greatly improved. The present invention has been completed based on the above.

That is, the present invention relates to a method for resist removal comprising forming an adhesive layer on an article on which a resist is present and peeling the adhesive layer as a united sheet including the resist material from the article, characterized in that the adhesive layer has been regulated so as to have a modulus of elasticity of 1 Kg/mm² or higher in the peeling.

The present invention further relates to an adhesive or adhesive sheet for resist removal which is used in the above-described method for resist removal and which gives or has an adhesive layer regulated so as to have a modulus of elasticity of 1 Kg/mm² or higher in the peeling.

The present invention furthermore relates to an adhesive sheet for resist removal which is used for peeling off a resist present on an article, characterized in that the adhesive sheet comprises a substrate and an adhesive layer formed thereon and optionally has a separator laminated to the surface of the adhesive layer, and that in the adhesive from which the separator has been peeled in preparation for use and in the substrate, the amount of any electrically active metallic element other than the Group IVA elements of the periodic table and compounds thereof is up to 20 ppm in terms of the amount of each metallic element.

The present invention furthermore relates to a method for resist removal comprising applying the adhesive sheet described above to an article on which a resist is present and peeling off the adhesive sheet as a united sheet including the resist, characterized in that the amount of any electrically active metallic element other than the Group IVA elements of the periodic table and compounds thereof which element and compounds are transferred from the adhesive sheet to the article each is up to $5\times10^{10}$ atom/cm² in terms of the density with respect to the number of atoms of each element.

MODES FOR CARRYING OUT THE INVENTION

In the method for resist removal of the present invention, a layer comprising an adhesive is first formed on an article on which a resist is present. For this layer formation, a method comprising directly applying an adhesive on the article may be used. Alternatively, use may be made of a method in which an adhesive layer is formed beforehand on a substrate to produce an adhesive sheet in the form of sheet, tape, or the like and this adhesive sheet is applied to the article.

The adhesive used here may be either a non-curable or curable one. However, the modulus of elasticity (which will be defined below) of the adhesive itself in the case of a non-curable one or the modulus of elasticity after curing in the case of a curable one is desirably regulated to about 1 Kg/mm² or higher, preferably about from 1 to 1,000 Kg/mm², especially about from 5 to 200 Kg/mm², as measured at the time of the peeling of the adhesive layer and the resist from the article. The reason for this is as follows. A non-curable adhesive is peeled as such without being subjected to a curing treatment, while a curable adhesive is peeled after being finally subjected to a curing treatment and cured wholly. In either case, however, when the adhesive has the above modulus of elasticity in peeling, a high film strength is obtained and the adhesive layer can be satisfactorily peeled as a united sheet including the resist material.

The term "modulus of elasticity" used above means a value obtained by a method comprising subjecting an adhesive having a sectional area of 0.5 mm² to a tensile test under the conditions of a standard distance of 10 mm, a temperature of 23° C., and a pulling rate of 50 mm/min to obtain a stress-strain curve and determining the modulus from the initial gradient.

Furthermore, the adhesive preferably gives such an adhesive layer that the adhesive strength between the adhesive layer for resist removal and the resist is higher than the adhesive strength between the resist and an article, e.g., a wafer. Specifically, the 180° peel adhesive strength between the adhesive layer and the resist is desirably regulated to about 5 g/10 mm or higher, especially about 5 to 5,000 g/10 mm, more preferably about 100 to 4,000 g/10 mm. If the adhesive strength between the adhesive layer and the resist is not higher than the adhesive strength between the resist and the article, there is a problem that it is difficult to completely peel off the whole resist. On the other hand, too high an adhesive strength between the adhesive layer and the resist may pose a problem that the wafer detaches from the wafer-fixing jig of the peeling device.

The term "180° peel adhesive strength", as will be explained in detail in Examples given later, herein means the adhesive strength determined by: applying an adhesive on a silicon wafer having a resist pattern on the surface thereof to form a film or applying to the silicon wafer with a hand roller an adhesive tape comprising a substrate and an adhesive layer formed thereon; and allowing the applied tape to stand for 3 minutes; and then peeling either the film formed from the adhesive or the adhesive tape at an angle of 180° under the conditions of 23° C. and a peeling rate of 300 mm/min.

The adhesive for use in the present invention is not particularly limited as long as it is capable of exhibiting the specific modulus of elasticity shown above and, more preferably, further exhibiting the specific 180° peel adhesive strength in peeling from resist. It may be a pressure-sensitive adhesive or an ordinary adhesive. Examples of the non-curable adhesive include thermoplastic resins such as poly (vinyl acetate), poly(vinyl acetal), poly(vinyl alcohol), poly ((meth)acrylic acid), poly((meth)acrylic ester)s, and various natural polymers. Preferably used are those having a weight-average molecular weight of 6,000 or higher, especially from 10,000 to 10,000,000, preferably from 100,000 to 5,000,000. If this molecular weight is too low, it is difficult to regulate the adhesive so as to have the aforementioned specific values of the modulus of elasticity and 180° peel adhesive strength in peeling from resist. On the other hand, if the molecular weight thereof is too high, there is a fear that the adhesive may be difficult to be formed into a sheet or the like. Usable examples of the curable adhesive include heat-curable or photo-curable adhesives obtained by adding a polymerizable monomer or oligomer shown later together with a heat- or photopolymerization initiator to adhesive polymers comprising the thermoplastic resins enumerated above, and further include thermosetting resins such as urea resins, phenolic resins, and epoxy resins.

In the present invention, a pressure-sensitive adhesive of the photocurable type, in particular the ultraviolet-curable type, is preferably used from the standpoints of working efficiency in curing and of eliminating thermal adverse influences on an article, e.g., a circuit board.

This pressure-sensitive adhesive is not particularly limited as long as it is capable of exhibiting the specific modulus of elasticity shown above and, more preferably, further exhibiting the specific 180° peel adhesive strength in peeling from resist. However, a preferred pressure-sensitive adhesive comprises a pressure-sensitive adhesive polymer and, incorporated therein, a compound having one or more unsaturated double bonds in the molecule. Examples of the pressure-sensitive adhesive polymer include an acrylic polymer produced using, as the main monomers, (meth)acrylic acid and/or (meth)acrylic esters selected from acrylic acid, alkyl acrylates, methacrylic acid, and alkyl methacrylates.

For producing this acrylic polymer, acrylic acid, methacrylic acid, and an ester of acrylic acid or methacrylic acid with an alcohol usually having up to 12 carbon atoms can be used as the above-described main monomers optionally together with a monomer having a carboxyl or hydroxyl group and other modifying monomers. These ingredients are polymerized by a method such as the solution polymerization, emulsion polymerization, suspension polymerization, or bulk polymerization method in an ordinary way, whereby the acrylic polymer can be obtained.

Usable examples of the monomer having a carboxyl group include maleic acid and itaconic acid, besides acrylic acid and methacrylic acid, which can be used also as the main monomer. Usable examples of the monomer having one or more hydroxyl groups include hydroxyethyl acrylate and hydroxypropyl acrylate. In the case of optionally using these monomers, the use amount thereof is usually preferably 20% by weight or smaller based on all monomers. Usable examples of other modifying monomers include vinyl acetate, vinyl propionate, styrene, acrylonitrile, acrylamide, and glycidyl methacrylate. In the case of using these modifying monomers, the use amount thereof is usually preferably 50% by weight or smaller based on the total amount of the monomers including the main monomer.

The molecular weight of the acrylic polymer constituted of such monomers is 6,000 or higher, usually from 10,000 to 10,000,000, especially preferably from 100,000 to 5,000,000, in terms of weight-average molecular weight. If the molecular weight thereof is too low, it is difficult to regulate the adhesive so as to have the aforementioned specific values of the modulus of elasticity and 90° peel adhesive strength in peeling from resist, as stated hereinabove. On the other hand, if the molecular weight thereof is too high, there is a fear that the adhesive may be difficult to be formed into a sheet or the like.

An acrylic polymer having unsaturated double bonds incorporated into the molecule thereof may be synthesized, for example, by using a compound having two or more unsaturated double bonds in the molecule as a comonomer in synthesizing an acrylic polymer, or by chemically bonding a compound having an unsaturated double bond in the molecule to a synthesized acrylic polymer through reaction between functional groups. Thus, this polymer itself can participate in polymerization/curing reaction upon ultraviolet irradiation.

The compound having one or more unsaturated double bonds in the molecule (hereinafter referred to as polymerizable unsaturated compound) is preferably a low-molecular compound which is nonvolatile and has a weight-average molecular weight of 10,000 or lower, especially preferably one having a molecular weight of 5,000 or lower so that the adhesive layer can be efficiently made to have a three-dimensional network structure in curing. The polymerizable unsaturated compound has excellent compatibility with acrylic polymers, contributes to the fluidization of the whole adhesive, and thereby brings about satisfactory results with respect to flow into recessed parts of the resist pattern and adhesion. Furthermore, this polymerizable unsaturated compound is desirably one which has excellent affinity for resist materials and high adhesive strength in adhesion to resist materials and does not flow out from the edge of the tape or sheet during storage.

Examples of the polymerizable unsaturated compound include phenoxy polyethylene glycol (meth)acrylate, ε-caprolactone (meth)acrylate, polyethylene glycol di(meth)acrylate, polypropylene glycol di(meth)acrylate, trimethylolpropane tri(meth)acrylate, pentaerythritol tetra(meth)acrylate, dipentaerythritol hexa(meth)acrylate, urethane (meth)acrylates, epoxy (meth)acrylates, oligoester (meth)acrylates, ethoxylated trimethylolpropane tri(meth)acrylates, ethoxylated pentaerythritol tetra(meth)acrylates, and polyester diacrylates. One or more compounds can be selected from these compounds according to the kind of the acrylic polymer used and the kind of the resist material to be removed.

Such a polymerizable unsaturated compound is used in an amount of usually from 5 to 300 parts by weight, preferably from 20 to 300 parts by weight, per 100 parts by weight of the pressure-sensitive adhesive polymer. If the use amount thereof is too small, the adhesive as a whole has reduced flowability and there are cases where the effect of peeling a resist material becomes insufficient. If the use amount thereof is too large, there is a fear that the adhesive may flow out during storage.

The polymerization initiator added to the curable pressure-sensitive adhesive for use in the present invention is not particularly limited, and a known initiator can be used. In the case where the adhesive is heat-curable, examples of the initiator include heat-polymerization initiators such as benzoyl peroxide and azobisisobutyronitrile. In the case where the adhesive is photo-curable, examples of the initiator include photopolymerization initiators such as benzoin, benzoin ethyl ether, dibenzyl, isopropyl benzoin ether, benzophenone, Michler's ketone chlorothioxanthone, dodecylthioxanthone, dimethylthioxanthone, acetophenone diethyl ketal, benzyl dimethyl ketal, α-hydroxycyclohexyl phenyl ketone, 2-hydroxymethylphenylpropane, and 2,2-dimethoxy-2-phenylacetophenone. These polymerization initiators are used in an amount in the range of usually from 0.1 to 15 parts by weight, preferably from 0.5 to 10 parts by weight, per 100 parts by weight of the pressure-sensitive adhesive polymer.

A crosslinking agent for crosslinking the pressure-sensitive adhesive polymer so as to obtain an adhesive having enhanced cohesive force is preferably incorporated into the curable pressure-sensitive adhesive, from the standpoints of improving the efficiency of application to an article such as a semiconductor wafer and efficiently peeling a resist material. For example, an acrylic polymer having carboxyl groups or hydroxyl groups preferably contains a polyfunctional compound capable of reacting with these functional groups. Examples of the polyfunctional compound include polyisocyanates such as diphenylmethane diisocyanate and tolylene diisocyanate, polyepoxys, various metal salts, and chelate compounds. The use amount of these polyfunctional compounds is up to 20 parts by weight per 100 parts by weight of the pressure-sensitive adhesive polymer. The amount thereof may be suitably selected in the above range so that a larger or a smaller amount is used when the molecular weight of the polymer is low or high, respectively. Too large use amounts are undesirable in that the adhesive strength between the adhesive layer and a resist material is reduced.

For the same purpose as of the use of those polyfunctional compounds, a filler such as finely powdered silica may be incorporated into the curable pressure-sensitive adhesive. Furthermore, various known additives such as tackifier resins, colorants, and antioxidants can be incorporated if desired. These various additives may be used in an amount ordinarily employed for general adhesives. The modulus of elasticity as described hereinabove means that of the whole adhesive containing these additives.

In the present invention, the above-described adhesive itself or an adhesive layer composed of the adhesive is formed on a substrate, whereby an adhesive sheet in the form of sheet, tape, or the like can be obtained. Usable examples of the substrate include plastic films comprising polyethylene, polypropylene, poly(ethylene terephthalate), a polyurethane, poly(vinyl chloride), an ethylene-vinyl acetate copolymer, or the like, nonwoven plastic fabrics, cloths made of synthetic plastic fibers or glass fibers, metal foils made of aluminum or stainless steel, and paper.

In the present invention, the moduli of elasticity of these substrates are preferably regulated to 1 Kg/mm$^2$ or higher, preferably from 1 to 1,000 Kg/mm$^2$. This regulation is effective in satisfactorily reinforcing the adhesive layer, and the adhesive layer can be satisfactorily peeled as a united sheet including the resist material. The modulus of elasticity is measured in accordance with the measurement method described hereinabove with respect to adhesives.

The thickness of the substrate is usually about from 10 to 500 μm. In the case where a photo-curable adhesive is used, a substrate which transmits light, such as, in particular, ultraviolet, is selected and used.

Especially preferably used in the present invention is an ultraviolet-curable pressure-sensitive adhesive sheet in a film or tape form obtained by applying an ultraviolet-curable pressure-sensitive adhesive on an ultraviolet-transmitting film substrate in a thickness of about from 10 to 180 μm on a dry basis. This film substrate is preferably an ultraviolet-transmitting plastic film made of polyethylene, polypropylene, poly(ethylene terephthalate), or the like and having a thickness of about from 12 to 100 μm.

In the method for resist removal of the present invention, an adhesive layer, preferably a pressure-sensitive adhesive layer, is formed on an article, e.g., a semiconductor wafer, on which a resist pattern is present, and heat or pressure is applied if necessary in order to improve adhesion between the resist material and the adhesive layer. In the case where the adhesive is a curable one, a suitable curing treatment with heating or light irradiation is conducted. In view of thermal influences on the article, e.g., wafer, it is desirable to use the photo-curable pressure-sensitive adhesive sheet described above and to conduct the curing treatment by irradiating the sheet with ultraviolet or the like. In the case of using ultraviolet, the irradiation dose is preferably about from 300 to 3,000 mj/cm$^2$.

Through this curing treatment, the adhesive cures to give a united sheet including the resist material. Thus, the modulus of elasticity of the adhesive can be increased significantly and a necessary tensile strength can be imparted thereto. Furthermore, since the adhesive cures after penetrating into recessed parts of the resist pattern, the adhesive strength between the adhesive layer and the resist can be increased to or above a specific value. As a result, the whole resist can be completely and easily peeled from the article, e.g., wafer.

The present invention further provides an adhesive sheet for resist removal which is used for peeling off a resist present on an article and comprises a substrate and an adhesive layer formed thereon. This adhesive sheet is characterized in that the amount of any electrically active metallic element other than the Group IVA elements of the periodic table and compounds thereof contained in the substrate and the adhesive is up to 20 ppm in terms of the amount of each metallic element. In the case where the above adhesive sheet has a separator laminated to the surface of the adhesive layer, it is characterized in that the amount of any of the aforementioned electrically active metallic elements and compounds thereof contained in the substrate and the adhesive from which the separator has been peeled in preparation for use is the same value as the above.

The present invention furthermore provides a method for resist removal comprising applying the adhesive sheet to an article on which a resist is present and peeling off the adhesive sheet as a united sheet including the resist, characterized in that the amount of any electrically active metallic element other than the Group IVA elements of the periodic table and compounds thereof which element and compounds are transferred from the adhesive sheet to the article is up to $5\times10^{10}$ atom/cm$^2$ in terms of the density with respect to the number of atoms of each element.

The electrically active metallic elements and compounds thereof herein mean the electrically active metallic elements other than the Group IVA elements of the periodic table, such as carbon, silicon, germanium, and tin, and compounds thereof. Examples thereof include metals such as alkali metals, alkaline earth metals, and antimony, many metallic elements such as copper, zinc, titanium, and manganese, and compounds of these with nonmetallic elements or organic substances. The amount of "up to 20 ppm" specified as content for these metallic elements and compounds thereof is given in terms of the amount of each metallic element.

In order to regulate the content of each electrically active metallic element and compounds thereof to the above value, the substrate and the separator each is preferably a film of a resin obtained by polymerization using as a catalyst an electrically less active metallic element or a compound thereof, e.g., a polyester resin such as poly(ethylene terephthalate) obtained by polymerization using as a catalyst a Group IVA element of the periodic table, such as germanium, or a compound of the element. Also preferred are a fabric woven of quartz glass fibers, paper, and the like which each has been regulated so as to have the above value. It is a matter of course that the substrate or separator is not particularly limited in the material thereof. Substrates or separators made of various materials may be used as long as the content of those substances therein has been regulated to the above value.

The same applies to the adhesive formed on the substrate. Any of a wide range of adhesives can be used as long as the content of any electrically active metallic element and compounds thereof in both the adhesive and the substrate is the above value. In general, an adhesive obtained by adding various ingredients according to need to the foregoing adhesive polymer reduced in the content of any of those metallic elements and compounds thereof is used.

In conducting polymerization for producing the adhesive polymer or another polymer, the chemicals used in the synthesis operation such as a polymerization catalyst and a salt for salting-out are desirably organic compounds, non-metallic compounds, or compounds of Group IVA elements of the periodic table such as germanium, which are electrically inactive elements, as in the above-described synthesis of resins for use as substrates and separators. Thus, electrically active metallic elements are prevented as highly as possible from coming into the acrylic polymer. If an active metallic element is used from necessity, the polymer obtained should be finally subjected to a sufficient purification/removal operation.

After the adhesive sheet is applied to an article, e.g., a semiconductor substrate, and subjected if necessary to a curing treatment as described above, the adhesive sheet is peeled as a united sheet including the resist film image, whereby the resist material is easily removed from the article. Since the amount of any electrically active metallic element, other than the group IVA elements of the periodic table, and compounds thereof contained in the adhesive sheet is up to 20 ppm in terms of the amount of the metallic element, the amount of any of those metallic elements and compounds thereof transferred to the article surface after resist removal can be as small as up to $5\times10^{10}$ atom/cm$^2$ in terms of the density with respect to the number of atoms of each element. Consequently, no electrical troubles arise in the article, e.g., semiconductor substrate, and satisfactory results are obtained with respect to yield and reliability in producing the article.

The present invention still further provides: a polymeric material for resist removal which is a polymeric material especially suitable for removing a resist present on an article and has a weight-average molecular weight of 6,000 or higher and an acid value of from 100 to 1,000; a polymeric material for resist removal which comprises the above polymeric material and incorporated therein a curable ingredient such as a polymerizable monomer or an oligomer thereof and has the property of curing by the action of heat or light; and an adhesive sheet for resist removal which comprises a substrate and formed thereon a layer comprising these polymeric materials.

The present invention still furthermore provides: a method for resist removal characterized by comprising coating a polymeric material for resist removal having the constitution described above on an article on which a resist is present and peeling the resultant coating film as a united sheet including the resist material, the peeling being conducted after curing of the polymeric material when this material has the property of curing by the action of heat or light; a method for resist removal which comprises applying a backing material to the surface coated with the polymeric material for resist removal and stripping off the backing material to thereby peel the coating film as a united sheet including the resist material; a method for resist removal which comprises applying the adhesive sheet for resist removal to an article on which a resist is present and peeling the adhesive sheet as a united sheet including the resist material, the peeling being conducted after curing of the layer comprising the polymeric material when the layer has the property of curing by the action of heat or light; and a method for resist removal wherein the application of the adhesive sheet for resist removal is conducted while applying heat or pressure thereto if necessary.

Besides synthetic polymers obtained by the condensation polymerization or radical polymerization of monomers, examples of the polymeric material include natural polymers. The polymeric material is a polymer having a weight-average molecular weight of from 6,000, preferably from 10,000, more preferably from 100,000, to usually about 5,000,000.

If the weight-average molecular weight thereof is lower than 6,000, the polymer gives a film which has reduced strength and undergoes breakage or cohesive failure in peeling with a resist. Hence, the resist cannot be sufficiently peeled off.

This polymeric material should have an acid value of from 100 to 1,000, preferably from 150 to 800. By regulating the acid value thereof to a value within that range, the polymeric material not only retains a satisfactory film strength, but also gives satisfactory results with respect to adhesion to a resist material and is highly effective in peeling off the resist. If the acid value thereof is lower than 100, adhesion to a resist material is reduced. If the acid value thereof exceeds 1,000, a reduced film strength results and this leads to breakage or cohesive failure in peeling. In either case, therefore, a resist cannot be sufficiently peeled off. The acid value means the number of milligrams of potassium hydroxide necessary to neutralize 1 g of the polymeric material.

Examples of this polymeric material include synthetic polymers such as polymers obtained by polymerizing or copolymerizing one or more monomers selected from carboxyl-containing monomers, sulfo-containing monomers, salts of these, and the like and polymers obtained by copolymerizing the above monomers with other monomers, and further include polymers obtained by partly or wholly hydrolyzing hydrolyzable polymers such as polymers of acid anhydrides, e.g., acrylic anhydride, maleic anhydride, citraconic anhydride, and dimethylmaleic anhydride, and polymers of (meth)acrylic esters.

Examples of the carboxyl-containing monomers include acrylic acid, α-substituted acrylic acids (α-substituent: alkyl groups, halogens, formamido, acetamido, benzamido, phenylacetamido, carbobenzyloxyamido, carboethoxyamido, chloroacetamido, phthalimido, etc.), β-substituted acrylic acids [β-substituent: methyl (crotonic acid), phenyl (cinnamic acid), etc.], and unsaturated dibasic acids [itaconic acid (α-carboxymethylacrylic acid), maleic acid, fumaric acid, etc.]. Examples of the sulfo-containing monomers include vinylsulfonic acid, styrenesulfonic acid, and sulfoalkylacrylamides (alkyl: alkylene groups having 2 to 6 carbon atoms).

Examples of the polymeric material for use in the present invention include synthetic polymers other than those shown above, such as condensation polymers, e.g., polyamides and polyesters, and carboxylated urethane acrylates. Also usable are natural polymers such as various polymers having carboxyl or sulfo groups in the molecule and modifications thereof such as carboxymethyl cellulose. Materials having the property of curing by the action of heat or light may also be used, which are obtained by mixing those various polymers with a curable ingredient such as a polymerizable monomer, e.g., acrylic acid dimer or pentaerythritol triacrylate, or an oligomer thereof. In the case of preparing such a curable material, the mixture as a whole is regulated so as to have the weight-average molecular weight and acid value as specified above.

In the present invention, such a polymeric material is applied by an appropriate means, e.g., a spin coater, on a resist film image present on an article, e.g., a semiconductor substrate. The resultant coating is subjected to a desired drying step according to the components of the polymeric material, etc., and especially in the case of a curable material, further to a suitable curing treatment. Thereafter, the coating film is peeled as a united sheet including the resist material. For the purpose of facilitating this peeling, a backing material may be applied to the surface coated with the polymeric material. By peeling this backing material, the coating film can be peeled as a united sheet including the resist material.

In the present invention, it is possible to produce an adhesive sheet in the form of sheet, tape, or the like which comprises the polymeric material described above and to use this adhesive sheet to conduct the same peeling operation as the above. For producing the adhesive sheet, a substrate such as a nonwoven fabric or a plastic film is used and the above-described polymeric material is coated on or transferred to the substrate to form a layer of the polymeric material usually in a thickness of about from 5 to 100 μm. The adhesive sheet thus produced is applied to a resist film image present on an article, e.g., a semiconductor substrate. The sheet applied is preferably subjected to a heating or pressing treatment in order to enhance adhesion to the image. In the case of a curable material, a suitable curing treatment is conducted. Thereafter, the adhesive sheet is peeled as a united sheet including the resist material.

According to the peeling of a coating film or adhesive sheet and a resist material as a united sheet comprising both, the resist film image is easily peeled off without fail, because of the excellent adhesion to the resist material and satisfactory film strength of the polymeric material which are attributable to the above-described properties of the polymeric material.

EXAMPLES

The present invention will be explained below by reference to Examples. Hereinafter, all "parts" are by weight.

Example 1-1

A resist material comprising a novolac and naphthoquinonediazide was applied on the surface of a silicon wafer (semiconductor substrate). Heating, exposure, and development were conducted to form a resist pattern on the whole wafer surface. Thereafter, arsenic ions were implanted in the whole surface at an accelerating energy of 80 keV in a dose of $1 \times 10^{16}$ ions/cm$^2$.

An aqueous solution prepared by dissolving poly(vinyl alcohol) (Gohsenol NH-26, manufactured by Kuraray Co., Ltd.) in distilled water in a concentration of 10% by weight was applied on the whole surface of the resist pattern on the silicon wafer in a thickness of 40 μm on a dry basis. The coating was dried at 140° C. for 5 minutes to form a layer of a pressure-sensitive adhesive. The modulus of elasticity of this layer was 19 Kg/mm$^2$. Thereafter, this pressure-sensitive adhesive layer was peeled, upon which the resist material peeled off as a united sheet including the adhesive layer. The surface of the silicon wafer was examined with a fluorescence microscope. As a result, any residue of the resist material, which remained adherent to the wafer surface, was not observed.

Example 1-2

An ultraviolet-curable epoxy resin (KR-400, manufactured by Asahi Denka Kogyo K.K.) was applied in a thickness of 40 μm on a substrate composed of a nonwoven polyethylene fabric having a thickness of 100 μm to produce a curable adhesive sheet. This adhesive sheet was applied to the whole surface of a resist pattern which had been formed on a silicon wafer and implanted with arsenic ions over the whole surface thereof in the same manner as in Example 1-1. The adhesive sheet applied was irradiated with 600 mj/cm$^2$ ultraviolet to cure the epoxy resin. The modulus of elasticity of the adhesive layer after curing was 8 Kg/mm$^2$. The modulus of elasticity of the nonwoven polyethylene fabric was 3 Kg/mm$^2$. Thereafter, this adhesive sheet was peeled, upon which the resist material was peeled off as a united sheet including the adhesive sheet. The surface of the silicon wafer was examined with a fluorescence microscope. As a result, any residue of the resist material, which remained adherent to the wafer surface, was not observed.

Example 1-3

Into a 1-liter flask equipped with a stirrer were introduced 20 g of 2-ethylhexyl acrylate, 95.5 g of methyl acrylate, 34.5 g of acrylic acid, and 225 g of ethyl acetate. In a nitrogen gas atmosphere, the contents were heated to 60° C. and 0.3 g of azobisisobutyronitrile was introduced as a polymerization initiator to conduct polymerization for 8 hours. As a result, the conversion into polymer was almost 100% by weight, and the polymer obtained had a weight-average molecular weight of 600,000.

The resultant polymer-containing solution was used as a solution of a pressure-sensitive adhesive and applied on a 50 μm-thick polyester film to provide a dry thickness of 40 μm.

The coating was dried at 140° C. for 5 minutes to produce a non-curable adhesive sheet. In this adhesive sheet, the modulus of elasticity of the layer composed of a pressure-sensitive adhesive was 14 kg/mm$^2$, while the modulus of elasticity of the polyester film was 400 kg/mm$^2$.

Subsequently, this adhesive sheet was applied, with pressing at 120° C., to the whole surface of a resist pattern which had been formed on a silicon wafer and implanted with arsenic ions over the whole surface thereof in the same manner as in Example 1-1. Thereafter, this adhesive sheet was peeled, upon which the resist material was peeled off as a united sheet including the adhesive sheet. The surface of the silicon wafer was examined with a fluorescence microscope. As a result, any residue of the resist material, which remained adherent to the wafer surface, was not observed.

Example 1-4

Into a 1-liter flask equipped with a stirrer were introduced 130 g of methyl acrylate, 20 g of acrylic acid, and 225 g of ethyl acetate. In a nitrogen gas atmosphere, the contents were heated to 60° C. and 0.3 g of azobisisobutyronitrile was introduced as a polymerization initiator to conduct polymerization for 8 hours. As a result, the conversion into polymer was almost 100% by weight, and the polymer obtained had a weight-average molecular weight of 560,000. With 100 g of this polymer solution were homogeneously mixed 12 g of pentaerythritol triacrylate and 0.8 g of 1-hydroxycyclohexyl phenyl ketone (Irgacure 184, manufactured by Ciba-Geigy Ltd.) as a photopolymerization initiator. Thus, a solution of a curable pressure-sensitive adhesive was prepared.

This solution was applied on a 50 μm-thick polyester film to provide a dry thickness of 40 μm. The coating was dried at 140° C. for 5 minutes to produce a curable adhesive sheet. When the adhesive layer was cured by irradiating the adhesive sheet with ultraviolet in a dose of 1 JKg/mm$^2$ using a high-pressure mercury lamp, the modulus of elasticity of the resultant pressure-sensitive adhesive layer was 49 kg/mm$^2$. The modulus of elasticity of the polyester film was 400 kg/mm$^2$.

Subsequently, this adhesive sheet was applied, with pressing at room temperature, to the whole surface of a resist pattern which had been formed on a silicon wafer and implanted with arsenic ions over the whole surface thereof in the same manner as in Example 1-1. The adhesive sheet applied was heated at 120° C. for 3 minutes and then irradiated with ultraviolet in a dose of 1 JKg/mm$^2$ using a high-pressure mercury lamp to cure the adhesive. Thereafter, this adhesive sheet was peeled, upon which the resist material was peeled off as a united sheet including the adhesive sheet. The surface of the silicon wafer was examined with a fluorescence microscope. As a result, any residue of the resist material which remained adherent to the wafer surface was not observed.

Example 1-5

Into a 1-liter flask equipped with a stirrer were introduced 30 g of 2-ethylhexyl acrylate, 30 g of methyl acrylate, 90 g of acrylic acid, and 225 g of methanol. In a nitrogen gas atmosphere, the contents were heated to 60° C. and 0.3 g of azobisisobutyronitrile was introduced as a polymerization initiator to conduct polymerization for 8 hours. As a result, the conversion into polymer was almost 100% by weight, and the polymer obtained had a weight-average molecular weight of 200,000.

The resultant polymer-containing solution was used as a solution of a pressure-sensitive adhesive and applied on a 50 μm-thick polyester film to provide a dry thickness of 40 μm. The coating was dried at 140° C. for 5 minutes to produce a non-curable adhesive sheet. In this adhesive sheet, the modulus of elasticity of the layer composed of a pressure-sensitive adhesive was 137 kg/mm$^2$, while the modulus of elasticity of the polyester film was 400 kg/mm$^2$.

Subsequently, this adhesive sheet was applied to the whole surface of a resist pattern which had been formed on a silicon wafer and implanted with arsenic ions over the whole surface thereof in the same manner as in Example 1-1. The adhesive sheet applied was heated for 1 minute on an 80° C. hot plate and then returned to room temperature (20° C.). Thereafter, this adhesive sheet was peeled, upon which the resist material was peeled off as a united sheet including the adhesive sheet. The surface of the silicon wafer was examined with a fluorescence microscope. As a result, any residue of the resist material, which remained adherent to the wafer surface, was not observed.

Comparative Example 1-1

Into a 1-liter flask equipped with a stirrer were introduced 142.9 g of butyl acrylate, 7.1 g of acrylic acid, and 225 g of ethyl acetate. In a nitrogen gas atmosphere, the contents were heated to 60° C. and 0.3 g of azobisisobutyronitrile was introduced as a polymerization initiator to conduct polymerization for 8 hours. As a result, the conversion into polymer was almost 100% by weight, and the polymer obtained had a weight-average molecular weight of 700,000.

The resultant polymer-containing solution was used as a solution of a pressure-sensitive adhesive and applied on a 50 μm-thick polyester film to provide a dry thickness of 40 μm. The coating was dried at 140° C. for 5 minutes to produce a non-curable adhesive sheet. In this adhesive sheet, the modulus of elasticity of the layer composed of a pressure-sensitive adhesive was 0.03 kg/mm$^2$.

Subsequently, this adhesive sheet was applied, with a hand roller at room temperature (20° C.), to the whole surface of a resist pattern which had been formed on a silicon wafer and implanted with arsenic ions over the whole surface thereof in the same manner as in Example 1-1. Thereafter, this adhesive sheet was peeled. As a result, the resist material was not peeled at all.

Comparative Example 1-2

Into a 1-liter flask equipped with a stirrer were introduced 70 g of butyl acrylate, 70 g of ethyl acrylate, 10 g of acrylic acid, and 225 g of ethyl acetate. In a nitrogen gas atmosphere, the contents were heated to 60° C. and 0.3 g of azobisisobutyronitrile was introduced as a polymerization initiator to conduct polymerization for 8 hours. As a result, the conversion into polymer was almost 100% by weight, and the polymer obtained had a weight-average molecular weight of 650,000.

The resultant polymer-containing solution was used as a solution of a pressure-sensitive adhesive and applied on a 50 μm-thick polyester film to provide a dry thickness of 40 μm. The coating was dried at 140° C. for 5 minutes to produce a non-curable adhesive sheet. In this adhesive sheet, the modulus of elasticity of the layer composed of a pressure-sensitive adhesive was 0.06 kg/mm$^2$.

Subsequently, this adhesive sheet was applied, with a hand roller at room temperature (20° C.), to the whole surface of a resist pattern which had been formed on a silicon wafer and implanted with arsenic ions over the whole surface thereof in the same manner as in Example 1-1.

Thereafter, this adhesive sheet was peeled. As a result, the resist material was not peeled at all.

Comparative Example 1-3

Cellophane Tape No. 29 (modulus of elasticity of the layer composed of a pressure-sensitive adhesive, 0.03 kg/mm$^2$), manufactured by Nitto Denko Corporation, was applied, with a hand roller at room temperature (20° C.), to the whole surface of a resist pattern which had been formed on a silicon wafer and implanted with arsenic ions over the whole surface thereof in the same manner as in Example 1-1. Thereafter, this cellophane tape was peeled. As a result, the resist material was not peeled at all.

Reference Example 2-1

A positive photoresist comprising a cresol novolac resin, an ester of a polyhydroxy compound with naphthoquinonediazidesulfonic acid, and ethyl lactate was applied on the surface of a 5-inch silicon wafer to provide a coat having a thickness of 1 μm. Heating, exposure, and development were conducted to form a resist patten (film image) on the whole surface. Thereafter, P+ions were implanted in the whole surface at an accelerating energy of 80 keV in a dose as high as 1×10$^{16}$ ions/cm$^2$ (hereinafter referred to as resist film image A).

Reference Example 2-2

A positive photoresist comprising a cresol novolac resin, an ester of a polyhydroxy compound with naphthoquinonediazidesulfonic acid, and ethyl lactate was applied on the surface of a 5-inch silicon wafer to provide a thickness of 5 μm. Heating, exposure, and development were conducted to form a resist patten (film image) on the whole surface. Thereafter, P$^+$ ions were implanted in the whole surface at an accelerating energy as high as 3.0 MeV in a dose of 5×10$^{13}$ ions/cm$^2$ (hereinafter referred to as resist film image B).

Example 2-1

In a hydrophilic solvent (methanol) were homogeneously dissolved 100 parts of poly(acrylic acid) having a weight-average molecular weight of 4,000,000, 50 parts of an ethoxylated pentaerythritol tetraacrylate, and 5 parts of α-hydroxycyclohexyl phenyl ketone as a photopolymerization initiator. Thus, a solution of a pressure-sensitive adhesive was prepared.

This solution was applied on a 50 μm-thick polyester film to provide a thickness of 40 μm on a dry basis. The coating was dried at 100° C. for 5 minutes to produce an adhesive sheet for resist removal.

The adhesive sheet for resist removal obtained was applied, with pressing at 120° C., to the whole surface of each of resist film images A and B obtained in the Reference Examples given above. Thereafter, the adhesive sheet applied was heated at 120° C. for 1 minute and then irradiated with ultraviolet in a dose of 1 J/cm$^2$ using a high-pressure mercury lamp to cure the adhesive.

The modulus of elasticity of the adhesive separately cured was measured, and was found to be 45 kg/mm$^2$. The 180° peel adhesive strength of the cured adhesive in peeling from resist was 215 g/10 mm. The modulus of elasticity of the polyester film used was 400 kg/mm$^2$.

Example 2-2

An adhesive sheet for resist removal was produced in the same manner as in Example 2-1, except that an ethoxylated trimethylolpropane triacrylate was used in place of the ethoxylated pentaerythritol tetraacrylate in the solution of a pressure-sensitive adhesive.

The adhesive sheet for resist removal obtained was cured with ultraviolet in the same manner as in Example 2-1. The modulus of elasticity of the adhesive separately cured was measured, and was found to be 25 kg/mm$^2$. The 180° peel adhesive strength of the cured adhesive in peeling from resist was 250 g/10 mm.

Example 2-3

An adhesive sheet for resist removal was produced in the same manner as in Example 2-1, except that the incorporation amount of the ethoxylated pentaerythritol tetraacrylate in Example 2-1 was changed to 150 parts.

The adhesive sheet for resist removal obtained was cured with ultraviolet in the same manner as in Example 2-1. The modulus of elasticity of the adhesive separately cured was measured, and was found to be 5 kg/mm$^2$. The 180° peel adhesive strength of the cured adhesive in peeling from resist was 65 g/10 mm.

Example 2-4

Eighty parts of n-butyl acrylate was introduced together with 15 parts of methyl acrylate, 5 parts of acrylic acid, and 150 parts of ethyl acetate. In a nitrogen atmosphere, the contents were heated to 60° C. and 0.3 parts of azobisisobutyronitrile was then introduced as a heat-polymerization initiator to conduct polymerization for 8 hours. As a result, the conversion into polymer was almost 100%, and the polymer obtained had a molecular weight of 750,000 in terms of weight-average molecular weight. With 250 parts of this polymer solution were homogeneously mixed 200 parts of a polyester diacrylate and 5 parts of α-hydroxycyclohexyl phenyl ketone as a photopolymerization initiator. Thus, a solution of a curable pressure-sensitive adhesive was obtained. This solution was used to produce an adhesive sheet for resist removal in the same manner as in Example 2-1.

The adhesive sheet for resist removal obtained was applied, with pressing at room temperature (20° C.), to the whole surface of each of resist film images A and B obtained in the Reference Examples given above. Thereafter, the adhesive sheet applied was heated at 120° C. for 3 minutes and then irradiated with ultraviolet in a dose of 1 J/cm$^2$ using a high-pressure mercury lamp to cure the adhesive. The modulus of elasticity of the adhesive separately cured was measured, and was found to be 38 kg/mm$^2$. The 180° peel adhesive strength of the cured adhesive in peeling from resist was 7 g/10 mm.

Example 2-5

An adhesive sheet for resist removal was produced in the same manner as in Example 2-4, except that 50 parts of an epoxy diacrylate and 50 parts of polyethylene glycol dimethacrylate were used in place of the polyester diacrylate used in Example 2-4.

The adhesive sheet for resist removal obtained was cured with ultraviolet in the same manner as in Example 2-4. The modulus of elasticity of the adhesive separately cured was measured, and was found to be 10 kg/mm$^2$. The 180° peel adhesive strength of the cured adhesive in peeling from resist was 55 g/10 mm.

Example 2-6

Into a 1-L flask equipped with a stirrer were introduced 30 g of MA (methyl acrylate), 120 g of AA (acrylic acid), and 225 g of ethyl acetate. In a nitrogen atmosphere, the contents were heated to 60° C. and 0.3 g of AIBN (azobisisobutyronitrile) was introduced as a heat-polymerization initiator to conduct polymerization for 8 hours. As a result, the conversion into polymer was almost 100%, and the polymer obtained had a molecular weight of 500,000 in terms of weight-average molecular weight. This solution was applied on a 50 µm-thick polyester film to provide a dry thickness of 40 µm. The coating was dried at 100° C. for 5 minutes to produce an adhesive sheet for resist removal.

The adhesive sheet for resist removal obtained was applied, with pressing at 120° C., to the whole surface of each of resist film images A and B obtained in the Reference Examples given above.

The modulus of elasticity of the adhesive separately dried was measured, and was found to be 80 kg/mm². The 180° peel adhesive strength of the adhesive in peeling from resist was 365 g/10 mm.

Example 2-7

With 100 g of the polymer solution obtained in Example 2-6 were homogeneously mixed 30 g of polyethylene glycol diacrylate and 2 g of 1-hydroxycyclohexyl phenyl ketone as a photopolymerization initiator. Thus, a solution of a curable pressure-sensitive adhesive was obtained.

This solution was applied on a 50 µm-thick polyester film to provide a dry thickness of 40 µm. The coating was dried at 100° C. for 5 minutes to produce an adhesive sheet for resist removal.

The adhesive sheet for resist removal obtained was applied, with pressing at 120° C., to the whole surface of each of resist film images A and B obtained in the Reference Examples given above. Thereafter, the adhesive sheet applied was heated at 120° C. for 3 minutes and irradiated with ultraviolet in a dose of 1 J/cm² using a high-pressure mercury lamp to cure the adhesive.

The modulus of elasticity of the adhesive separately cured was measured, and was found to be 35 kg/mm². The 180° peel adhesive strength of the cured adhesive in peeling from resist was 315 g/10 mm.

Comparative Example 2-1

Into a 1-L flask equipped with a stirrer were introduced 140 parts of butyl acrylate, 10 parts of acrylic acid, and 225 parts of ethyl acetate. In a nitrogen atmosphere, the contents were heated to 60° C. and 0.3 parts of azobisisobutyronitrile was then introduced to conduct polymerization for 8 hours. As a result, the conversion into polymer was almost 100%, and the polymer obtained had a molecular weight of 550,000 in terms of weight-average molecular weight. With 250 parts of this polymer solution were homogeneously mixed 50 parts of polyethylene glycol diacrylate and 5 parts of α-hydroxycyclohexyl phenyl ketone. Thus, a solution of a curable pressure-sensitive adhesive was obtained. This solution was applied to a 50 µm-thick polyester film to provide a dry thickness of 40 µm. The coating was dried at 140° C. for 5 minutes to produce an adhesive sheet for resist removal.

The adhesive sheet for resist removal obtained was applied, with pressing at room temperature (20° C.), to the whole surface of each of resist film images A and B obtained in the Reference Examples given above. Thereafter, the adhesive sheet applied was heated at 120° C. for 3 minutes and then irradiated with ultraviolet in a dose of 1 J/cm² using a high-pressure mercury lamp to cure the adhesive. The modulus of elasticity of the adhesive separately cured was measured, and was found to be 0.08 kg/mm². The 180° peel adhesive strength of the cured adhesive in peeling from resist was 185 g/10 mm.

Comparative Example 2-2

Into a 1-L flask equipped with a stirrer were introduced 70 parts of butyl acrylate, 70 parts of ethyl acrylate, 10 parts of acrylic acid, and 225 parts of ethyl acetate. In a nitrogen atmosphere, the contents were heated to 60° C. and 0.3 parts of azobisisobutyronitrile was then introduced to conduct polymerization for 8 hours. As a result, the conversion into polymer was almost 100%, and the polymer obtained had a molecular weight of 600,000 in terms of weight-average molecular weight. This solution was applied to a 50 µm-thick polyester film to provide a dry thickness of 40 µm. The coating was dried at 140° C. for 5 minutes to produce an adhesive sheet for resist removal.

The adhesive sheet for resist removal obtained was applied, with pressing at room temperature (20° C.), to the whole surface of each of resist film images A and B obtained in the Reference Examples given above. The modulus of elasticity of the adhesive was separately measured, and was found to be 0.06 kg/mm². The 180° peel adhesive strength of the adhesive in peeling from resist was 140 g/10 mm.

Comparative Example 2-3

Cellophane Tape No. 29 (substrate: cellulosic film, pressure-sensitive adhesive: natural rubber type), manufactured by Nitto Denko Corporation, was applied, with a hand roller at room temperature (20° C.), to the wafers produced in the Reference Examples. The pressure-sensitive adhesive of the tape was collected, and the modulus of elasticity thereof was measured and was found to be 0.03 kg/mm². The 180° peel adhesive strength of the tape in peeling from resist was 250 g/10 mm.

Each of the adhesive sheets for resist removal which had been applied in the Examples and Comparative Examples given above was peeled from the wafer (peeling conditions: the sheet was peeled at a rate of 10 mm/sec along a silicone rubber roll having a diameter of 40 mm), and the surface of the wafer was examined with a fluorescence microscope. The results obtained are shown in Table 2-1. The Table shows that according to the method for resist removal of the present invention, resist materials can be satisfactorily removed from the wafers.

TABLE 2-1

|  | Resist Film Image A | Resist Film Image B |
| --- | --- | --- |
| Example 2-1 | ⊚ | ⊚ |
| Example 2 | ⊚ | ⊚ |
| Example 3 | ○ | ⊚ |
| Example 4 | ○ | ⊚ |
| Example 5 | ○ | ⊚ |
| Example 6 | ⊚ | ⊚ |
| Example 7 | ⊚ | ⊚ |
| Comparative Example 2-1 | x | x |
| Comparative Example 2 | x | x |

TABLE 2-1-continued

|   | Resist Film Image A | Resist Film Image B |
|---|---|---|
| Comparative Example 3 | x | x |

⊚: no resist material was observed
o: almost no resist material was observed
x: resist material was not peeled at all

Example 3-1

As a substrate was used film A which was made of poly(ethylene terephthalate) synthesized using a germanium-based polymerization catalyst and had a thickness of 50 µm. Acrylic pressure-sensitive adhesive solution a composed of 100 parts of acrylic polymer A, 70 parts of polyethylene glycol acrylate (molecular weight, 308), 3 parts of a polyisocyanate compound, and 3 parts of α-hydroxycyclohexyl phenyl ketone was applied on film A to provide a dry thickness of 30 µm. The coating was dried to produce a pressure-sensitive adhesive sheet for resist removal.

Example 3-2

A pressure-sensitive adhesive sheet for resist removal was produced in the same manner as in Example 3-1, except that acrylic pressure-sensitive adhesive solution b composed of 100 parts of acrylic polymer B, 50 parts of polyethylene glycol acrylate (molecular weight, 708), 3 parts of a polyisocyanate compound, and 3 parts of α-hydroxycyclohexyl phenyl ketone was used in place of acrylic pressure-sensitive adhesive solution a.

Example 3-3

A pressure-sensitive adhesive sheet for resist removal was produced in the same manner as in Example 3-1, except that acrylic pressure-sensitive adhesive solution c composed of 100 parts of acrylic polymer C, 50 parts of dipentaerythritol hexa-5-hydroxycaproate acrylate, 3 parts of a polyisocyanate compound, and 3 parts of α-hydroxycyclohexyl phenyl ketone was used in place of acrylic pressure-sensitive adhesive solution a.

Example 3-4

As a separator was used separator A obtained by treating one side of poly(ethylene terephthalate) film A, used as a substrate in Example 3-1, with a silicone. This separator A was laminated to the adhesive side of the pressure-sensitive adhesive sheet produced in Example 3-1. Thus, a separator-bearing pressure-sensitive adhesive sheet for resist removal was produced.

Comparative Example 3-1

As a substrate was used film B which was made of poly(ethylene terephthalate) synthesized using an antimony-based polymerization catalyst and had a thickness of 50 µm. Acrylic pressure-sensitive adhesive solution a used in Example 3-1 was applied on film B to provide a dry thickness of 30 µm. The coating was dried to produce a pressure-sensitive adhesive sheet for resist removal.

Comparative Example 3-2

A pressure-sensitive adhesive sheet for resist removal was produced in the same manner as in Comparative Example 3-1, except that acrylic pressure-sensitive adhesive solution b used in Example 3-2 was used in place of acrylic pressure-sensitive adhesive solution a.

Comparative Example 3-3

A pressure-sensitive adhesive sheet for resist removal was produced in the same manner as in Comparative Example 3-1, except that acrylic pressure-sensitive adhesive solution c used in Example 3-3 was used in place of acrylic pressure-sensitive adhesive solution a.

Comparative Example 3-4

Separator A used in Example 3-4 was laminated to the pressure-sensitive adhesive side of the pressure-sensitive adhesive sheet produced in Comparative Example 3-1. Thus, a separator-bearing pressure-sensitive adhesive sheet for resist removal was produced.

Each of the pressure-sensitive adhesive sheets for resist removal obtained in Examples 3-1 to 3-4 and Comparative Examples 3-1 to 3-4 given above was examined for the amount of each of various metallic elements and compounds thereof (in terms of the amount of each metallic element) contained in the substrate and the pressure-sensitive adhesive. The results were as shown in Tables 3-1 and 3-2. For the above examination, the following elemental analysis method 1 was used for titanium and germanium, while the following elemental analysis method 2 was used for the other elements. With respect to the separator-bearing pressure-sensitive adhesive sheets for resist removal obtained in Example 3-4 and Comparative Example 3-4, the above examination was conducted after the separator was peeled.

[Elemental Analysis Method 1]

(1) A pressure-sensitive adhesive sheet composed of a substrate and a pressure-sensitive adhesive was heated in a quartz crucible. (2) The resultant ash was decomposed with sulfuric/nitric acid. After the mixture was heated to vaporize and remove the sulfuric acid, diluted nitric acid was added. (3) The solution was diluted with distilled water, and assayed by IPC emission analysis. (4) Since germanium, in particular, is a readily vaporizable element, the decomposition operation was conducted under mild conditions, and an addition-recovery test was conducted to ascertain the yield.

[Elemental Analysis Method 2]

(1) A pressure-sensitive adhesive sheet composed of a substrate and a pressure-sensitive adhesive was heated in a platinum basin at 550° C. (2) The resultant ash was dissolved in sulfuric/nitric acid. The solution was diluted with diluted hydrochloric acid, and assayed by IPC emission analysis. (4) Since antimony, in particular, is a readily vaporizable element, the decomposition operation was conducted under mild conditions, and an addition-recovery test was conducted to ascertain the yield.

TABLE 3-1

Bulk Analysis Data for Pressure-sensitive Adhesive Sheet (ppm)

| | K | Ca | Ti | Mn | Fe | Ni | Cu | Zn | Ce | Sb |
|---|---|---|---|---|---|---|---|---|---|---|
| Example 3-1 | 1.9 | 0.20 | ≦1.0 | ≦0.05 | 0.32 | 0.19 | ≦0.02 | 1.4 | 10 | 0.92 |
| Example 3-2 | 1.4 | 1.8 | ≦1.0 | ≦0.05 | 0.55 | 0.15 | ≦0.02 | 0.95 | 11 | 1.0 |
| Example 3-3 | 1.0 | 1.7 | ≦1.0 | ≦0.05 | 0.77 | 0.15 | ≦0.02 | 1.3 | 9 | 0.75 |
| Example 3-4 | 1.7 | 0.94 | ≦1.0 | ≦0.05 | 0.36 | 0.20 | ≦0.02 | 1.1 | 9 | 0.61 |

TABLE 3-2

Bulk Analysis Data for Pressure-sensitive Adhesive Sheet (ppm)

| | K | Ca | Ti | Mn | Fe | Ni | Cu | Zn | Ge | Sb |
|---|---|---|---|---|---|---|---|---|---|---|
| Comparative Example 3-1 | 1.2 | 4.7 | ≦1.0 | 0.21 | 0.48 | 0.13 | 0.09 | 1.2 | ≦0.2 | 150 |
| Comparative Example 3-2 | 1.4 | 5.4 | ≦1.0 | 0.52 | 0.81 | 0.09 | 0.08 | 1.9 | ≦0.2 | 150 |
| Comparative Example 3-3 | 1.7 | 5.4 | ≦1.0 | 0.38 | 0.33 | 0.11 | 0.13 | 1.2 | ≦0.2 | 160 |
| Comparative Example 3-4 | 1.1 | 3.9 | ≦1.0 | 0.39 | 0.46 | 0.15 | 0.08 | 1.3 | 1.4 | 170 |

Subsequently, using each of the pressure-sensitive adhesive sheets for resist removal obtained in Examples 3-1 to 3-4 and Comparative Examples 3-1 to 3-4 given above, a resist film image removal test was conducted in the following manner.

First, each pressure-sensitive adhesive sheet was applied, with pressing on a 130° C. hot plate, to the whole surface of a resist film image formed on a silicon wafer by the method shown below. Subsequently, the adhesive sheet applied was irradiated with ultraviolet in a dose of 1 J/cm$^2$ using a high-pressure mercury lamp to conduct a curing treatment. Thereafter, this pressure-sensitive adhesive sheet was peeled. As a result, with respect to each pressure-sensitive adhesive sheet, the resist film image was peeled off as a united sheet including the pressure-sensitive adhesive sheet.
[Formation of Resist Film Image]

A positive photoresist comprising a cresol novolac resin, an ester of a polyhydroxy compound with naphthoquinonediazidesulfonic acid, and ethyl lactate was applied on the surface of a silicon wafer (semiconductor substrate). Heating, exposure, development, and post-bake were conducted to form a resist film image (resist pattern) on the whole surface. Thereafter, P+ions were implanted in the whole surface in a concentration of $1\times10^{12}$ ions/cm$^2$.

After the peeling and removal with each pressure-sensitive adhesive sheet in the above test for resist film image removal, the metallic elements transferred to the silicon wafer surface were analyzed by total-reflection fluorescent X-ray analysis using a W-L$\beta$1 line and an Mo-K$\alpha$1 line. For the determination, silicon wafers contaminated with nickel in known concentrations were used. The results were as shown in Table 3-3.

In Table 3-3, "ND" means that the amount was below the minimum limit of detection. The minimum limit of detection for each metallic element is as follows.

K: $2.0\times10^{10}$ atom/cm$^2$
Ca: $1.6\times10^{10}$ atom/cm$^2$
Ti: $1.0\times10^{10}$ atom/cm$^2$
Mn: $0.40\times10^{10}$ atom/cm$^2$
Fe: $0.32\times10^{10}$ atom/cm$^2$
Ni: $0.20\times10^{10}$ atom/cm$^2$
Cu: $0.18\times10^{10}$ atom/cm$^2$
Zn: $0.15\times10^{10}$ atom/cm$^2$
Ge: $2.0\times10^{10}$ atom/cm$^2$
Sb: $3.3\times10^{10}$ atom/cm$^2$

TABLE 3-3

| | Surface Analysis Data for Silicon Wafer (×10¹⁰ atom/cm²) | | | | | | | | | |
|---|---|---|---|---|---|---|---|---|---|---|
| | K | Ca | Ti | Mn | Fe | Ni | Cu | Zn | Ge | Sb |
| Example 3-1 | ND | ND | ND | ND | ND | ND | ND | ND | 2.1 | ND |
| Example 3-2 | ND | ND | ND | ND | ND | ND | ND | ND | ND | ND |
| Example 3-3 | ND | ND | ND | ND | ND | ND | ND | ND | ND | ND |
| Example 3-4 | ND | ND | ND | ND | ND | ND | ND | ND | 2.8 | ND |
| Comparative Example 3-1 | ND | ND | ND | ND | ND | ND | ND | ND | ND | 7.1 |
| Comparative Example 3-2 | ND | ND | ND | ND | ND | ND | ND | ND | ND | 8.6 |
| Comparative Example 3-3 | ND | ND | ND | ND | ND | ND | ND | ND | ND | 14 |
| Comparative Example 3-4 | ND | ND | ND | ND | ND | ND | ND | ND | ND | 10 |

Subsequently, each of the pressure-sensitive adhesive sheets for resist removal obtained in Examples 3-1 to 3-4 and Comparative Examples 3-1 to 3-4 given above was applied directly to a silicon wafer, namely not through a resist film image, to examine the transfer of impurities (metallic elements). That is, each pressure-sensitive adhesive sheet was applied to the mirror surface of a silicon wafer cleaned with ultrapure water, subsequently irradiated with ultraviolet in a dose of 1 J/cm² using a high-pressure mercury lamp to conduct a curing treatment, and then peeled. After the peeling, the metallic elements transferred to the mirror surface of the silicon wafer were analyzed in the same manner as the above. The results are shown in Table 3-4, together with results of the analysis of the mirror surface of a silicon wafer immediately after cleaning with ultrapure water, i.e., prior to the application of a pressure-sensitive adhesive sheet (Control Example 3-1).

was extremely small and the amounts of the metallic elements (excluding germanium) other than antimony were also small.

The results given in Table 3-3 show the following. When each of the pressure-sensitive adhesive sheets of Comparative Examples 3-1 to 3-4 was used for peeling off a resist film image from a silicon wafer, the amount of antimony transferred to the silicon wafer surface was as large as (7.1 to 14)×10¹⁰ atom/cm². In contrast, in the case of the pressure-sensitive adhesive sheets of Examples 3-1 to 3-4 according to the present invention, that transfer amount was as small as below the minimum limit of detection, i.e., $3.3 \times 10^{10}$ atom/cm².

Furthermore, the results given in Table 3-4 show the following. When each of the pressure-sensitive adhesive sheets of Comparative Examples 3-1 to 3-4 was directly applied to a silicon wafer, that transfer amount was (6.8 to

TABLE 3-4

| | Surface Analysis Data for Silicon Wafer (×10¹⁰ atom/cm²) | | | | | | | | | |
|---|---|---|---|---|---|---|---|---|---|---|
| | K | Ca | Ti | Mn | Fe | Ni | Cu | Zn | Ge | Sb |
| Example 3-1 | ND | ND | ND | ND | 0.33 | 0.56 | ND | 0.21 | 4.2 | ND |
| Example 3-2 | ND | ND | ND | ND | 0.51 | 0.58 | ND | 0.60 | 9.5 | ND |
| Example 3-3 | ND | ND | ND | ND | 1.0 | 0.44 | 0.29 | 0.73 | 6.7 | ND |
| Example 3-4 | ND | ND | ND | ND | 1.2 | 0.68 | 0.59 | 0.68 | 8.3 | ND |
| Comparative Example 3-1 | ND | ND | ND | ND | ND | 0.47 | 0.20 | 0.58 | ND | 92 |
| Comparative Example 3-2 | ND | ND | ND | 2.2 | 0.98 | 0.28 | 0.26 | 0.99 | ND | 85 |
| Comparative Example 3-3 | ND | ND | ND | ND | 0.66 | 0.39 | ND | 0.17 | ND | 68 |
| Comparative Example 3-4 | ND | ND | ND | ND | 0.60 | 0.39 | 0.18 | ND | ND | 89 |
| Control Example 3-1 | ND | ND | ND | ND | ND | ND | ND | ND | ND | ND |

The results given in Tables 3-1 and 3-2 show the following. In each of the pressure-sensitive adhesive sheets of Comparative Examples 3-1 to 3-4, the amount of antimony contained in both the substrate and the pressure-sensitive adhesive was as large as 150 ppm or more. In contrast, in the pressure-sensitive adhesive sheets of Examples 3-1 to 3-4 according to the present invention, that antimony amount 9.2)×10¹¹ atom/cm², which was even larger than the above value. In contrast, in the case of the pressure-sensitive adhesive sheets of Examples 3-1 to 3-4 according to the present invention, that transfer amount remained as small as below the minimum limit of detection, i.e., $3.3 \times 10^{10}$ atom/cm². Thus, that transfer amount was considerably small even when these adhesive sheets were directly applied to silicon wafers.

As apparent from these results, in the method for peeling a resist film image from a silicon wafer with any of the pressure-sensitive adhesive sheets of Comparative Examples 3-1 to 3-4, it is highly probable that impurity elements contained in the pressure-sensitive adhesive sheet are transferred to arouse electrical troubles, which pose problems such as the reduced yield and reliability of wafers. In contrast, it can be seen that the pressure-sensitive adhesive sheets of Examples 3-1 to 3-4 according to the present invention are effective in mitigating such problems and contribute to considerable improvements in the yield and reliability of wafers.

Reference Example 4-1

A resist material comprising a novolac resin and naphthoquinonediazide was applied on the surface of a silicon wafer (semiconductor substrate). Heating, exposure, and development were conducted to form a resist film image on the whole surface. Thereafter, arsenic ions were implanted in the whole surface at an accelerating energy of 80 KeV in a concentration of $1 \times 10^{16}$ ions/cm².

Example 4-1

Poly(acrylic acid) (weight-average molecular weight, 100,000; acid value, 780) was used as a polymeric material for resist removal. A 10 g portion thereof was dissolved in 40 g of water, giving a solution. Subsequently, this solution was applied on the semiconductor substrate obtained in Reference Example 4-1 with a spin coater to provide a dry thickness of 30 μm. After an 80 μm-thick glass cloth (density: 80 fibers per inch for warps and wefts) was applied to the substrate on its coating side, the coated substrate was dried in a drying oven at 80° C. and 130° C. each for 3 minutes. Thereafter, the glass cloth was stripped off carefully together with the coating film made of the poly(acrylic acid). As a result, the resist film image was peeled off as a united sheet including the cloth and coating. On the semiconductor substrate surface, only a trace amount of a residue of the resist material was observed, and almost no residue of the coating film made of the poly(acrylic acid) was observed.

Example 4-2

The solution of poly(acrylic acid) obtained in Example 4-1 was applied on a nonwoven polyester fabric having a thickness of 50 μm. Thereafter, the coated fabric was heated and dried in the same manner as in Example 4-1 to produce an adhesive sheet for resist removal having a 40 μm-thick layer made of the poly(acrylic acid). This adhesive sheet was applied to the semiconductor substrate obtained in Reference Example 4-1 by means of pressure rolls with heating at 130° C. Four minutes thereafter, the adhesive sheet was stripped off at room temperature. As a result, the resist film image was peeled off as a united sheet including the adhesive sheet. On the semiconductor substrate, no residue of the resist material was observed and there was no particular adherent residue of the layer made of the poly(acrylic acid).

Example 4-3

A copolymer of methyl acrylate and acrylic acid in a weight ratio of 20:80 (weight-average molecular weight, 550,000; acid value, 623) was used as a polymeric material for resist removal. A 20 g portion of this copolymer was dissolved in 100 g of methanol, giving a solution. This solution was applied on the semiconductor substrate obtained in Reference Example 4-1, and the same glass cloth as in Example 4-1 was applied. The coated substrate was dried in the same manner as in Example 4-1. Thereafter, the glass cloth was stripped off together with the coating film made of the copolymer. As a result, the resist film image was peeled off as a united sheet including the cloth and coating. On the semiconductor substrate, no residue of the resist material was observed and there was no particular adherent residue of the layer made of the copolymer.

Example 4-4

A hundred parts of a copolymer of n-butyl acrylate, acrylic acid, and acrylonitrile in a weight ratio of 90:3:7 was mixed with 100 parts of acrylic acid dimer, 3 parts of a butanol-modified melamine resin, and 20 parts of a photopolymerization catalyst to obtain a polymeric material for resist removal. This material as a mixture had a weight-average molecular weight of 280,000 and an acid value of 205. A solution of this material was applied on a polyester film and dried in the same manner as in Example 4-2 to produce an adhesive sheet for resist removal which had a 40 μm-thick layer made of the polymeric material.

This adhesive sheet was applied, in the same manner as in Example 4-2, to the semiconductor substrate obtained in Reference Example 4-1. The adhesive sheet applied was irradiated with ultraviolet in a dose of 2,000 mj/cm² using a high-pressure mercury lamp to cure the adhesive. Thereafter, this adhesive sheet was stripped off. As a result, the resist film image was peeled off as a united sheet including the adhesive sheet. On the semiconductor substrate, no residue of the resist material was observed and there was no particular adherent residue of the layer formed from the polymeric material.

Example 4-5

A hundred parts of a copolymer of methyl acrylate and acrylic acid in a weight ratio of 20:80 was mixed with 50 parts of tetraethylene glycol diacrylate, 3 parts of a butanol-modified melamine resin, and 20 parts of a photopolymerization catalyst to obtain a polymeric material for resist removal. This material as a mixture had a weight-average molecular weight of 440,000 and an acid value of 628. A solution of this material was applied on a polyester film and dried in the same manner as in Example 4-4 to produce an adhesive sheet for resist removal which had a 40 μm-thick layer made of the polymeric material.

This adhesive sheet was applied, in the same manner as in Example 4-2, to the semiconductor substrate obtained in Reference Example 4-1. The adhesive sheet applied was irradiated with ultraviolet in a dose of 2,000 mj/cm² using a high-pressure mercury lamp to cure the adhesive. Thereafter, this adhesive sheet was stripped off. As a result, the resist film image was peeled off as a united sheet including the adhesive sheet. On the semiconductor substrate, no residue of the resist material was observed and there was no particular adherent residue of the layer formed from the polymeric material.

Comparative Example 4-1

A copolymer of 2-ethylhexyl acrylate and acrylic acid in a weight ratio of 95:5 (weight-average molecular weight, 650,000; acid value, 40) was used as a polymeric material for resist removal. A 20 g portion of this copolymer was dissolved in 100 g of ethyl acetate, giving a solution. This solution was applied, in the same manner as in Example 4-1, on the semiconductor substrate obtained in the Reference Example, and the same glass cloth as in Example 4-1 was applied to the substrate on its coating side. The coated substrate was dried in the same manner as in Example 4-1. Thereafter, the glass cloth was stripped off together with the coating film made of the copolymer. However, the resist film image was not peeled at all.

Comparative Example 4-2

A hundred parts of a copolymer of n-butyl acrylate, acrylic acid, and acrylonitrile in a weight ratio of 90:3:7 was mixed with 100 parts of pentaerythritol triacrylate, 3 parts of a butanol-modified melamine resin, and 20 parts of a photopolymerization catalyst to obtain a polymeric material for resist removal. This material as a mixture had a weight-average molecular weight of 650,000 and an acid value of 25. A solution of this material was applied on a polyester film and dried in the same manner as in Example 4-4 to produce an adhesive sheet for resist removal which had a 40 μm-thick layer made of the polymeric material. This adhesive sheet was applied, in the same manner as in Example 4-2, to the semiconductor substrate obtained in Reference Example 4-1. The adhesive sheet applied was irradiated with ultraviolet in a dose of 2,000 mj/cm$^2$ using a high-pressure mercury lamp to cure the adhesive. Thereafter, this adhesive sheet was stripped off. However, only a small proportion of the resist film image was peeled off.

Comparative Example 4-3

Poly(acrylic acid) (weight-average molecular weight, 5,000; acid value, 784) was used as a polymeric material for resist removal. A 20 g portion thereof was dissolved in 80 g of water, giving a solution. This solution was applied, in the same manner as in Example 4-1, on the semiconductor wafer obtained in the Reference Example, and the same glass cloth as in Example 4-1 was applied to the substrate on its coating side. The coated substrate was dried in the same manner as in Example 4-1. Thereafter, the glass cloth was stripped off together with the coating film made of the poly(acrylic acid). However, the resist film image was not peeled at all.

POSSIBILITY OF INDUSTRIAL APPLICATION

As described above, the method for resist removal of the present invention has effects that there is no fear of the necessity of a long operation period, as in the case of using an asher, or the implantation of impurity ions in wafers from a resist material, and that the method does not impair the working atmosphere because of the nonuse of a solvent and is capable of extremely easily removing a resist material without fail. In particular, since the adhesive has the modulus of elasticity specified hereinabove and a satisfactory tensile strength, a resist material can be completely peeled off even when a surface layer of the resist material has denatured and become a rigid layer through ion implantation, etc.

Besides the above effects, the method has a further effect that there is no fear that impurities contained in an adhesive sheet may be transferred to the surface of an article, such as a semiconductor substrate, from which a resist film image is removed, and the resultant electrical troubles may cause problems such as decreases in the yield and reliability of the article. Thus, the method of the invention can attain improvements in the yield and reliability.

We claim:

1. A method for resist removal comprising forming an adhesive layer on an article on which a resist is present and peeling the adhesive layer as a united sheet including the resist material from the article, characterized in that the adhesive layer has been regulated so as to have a modulus of elasticity of 1 Kg/mm$^2$ or higher in the peeling.

2. The method for resist removal as claimed in claim 1, characterized in that the adhesive strength between the adhesive layer and the resist has been regulated so as to be higher than the adhesive strength between the resist and the article.

3. The method for resist removal as claimed in claim 2, characterized in that the 180° peel adhesive strength between the adhesive layer and the resist is 5 g/10 mm or higher.

4. The method for resist removal as claimed in claim 1, characterized in that the adhesive layer is a layer comprising a non-curable adhesive.

5. The method for resist removal as claimed in claim 1, characterized in that the adhesive layer is a layer comprising a curable adhesive.

6. The method for resist removal as claimed in claim 5, characterized in that the adhesive layer is a layer comprising an ultraviolet-curable adhesive.

7. The method for resist removal as claimed in claim 1, wherein the adhesive layer is formed on a substrate wherein the amount of any electrically active metallic element other than the Group IVA is not more than 20 PPM in terms of the metallic element.

8. The method for resist removal as claimed in claim 1, wherein the amount of any electrically active metallic element other than the Group IVA of the periodic table and compounds thereof which are transferred from adhesive sheet to the article is not more than $5 \times 10^{10}$ atom/cm$^2$ in terms of the density with respect to the number of atoms of each element.

* * * * *